United States Patent
Bi et al.

(10) Patent No.: US 11,708,271 B2
(45) Date of Patent: Jul. 25, 2023

(54) METHOD FOR PRODUCING A GRAPHENE FILM

(71) Applicants: Corning Incorporated, Corning, NY (US); Shanghai Institute of Ceramics (SICCAS), Shanghai (CN)

(72) Inventors: Hui Bi, Shanghai (CN); Fuqiang Huang, Shanghai (CN); Xinyuan Liu, Painted Post, NY (US); Zhen Song, Painted Post, NY (US); Yufeng Tang, Shanghai (CN); Tongping Xiu, Shanghai (CN)

(73) Assignees: Corning Incorporated, Corning, NY (US); Shanghai Institute of Ceramics, Chinese Academy of Sciences, Shanghai (CN)

(*) Notice: Subject to any disclaimer, the term of this patent is extended or adjusted under 35 U.S.C. 154(b) by 1360 days.

(21) Appl. No.: 16/062,301

(22) PCT Filed: Dec. 9, 2016

(86) PCT No.: PCT/US2016/065798
§ 371 (c)(1),
(2) Date: Jun. 14, 2018

(87) PCT Pub. No.: WO2017/106035
PCT Pub. Date: Jun. 22, 2017

(65) Prior Publication Data
US 2018/0362393 A1    Dec. 20, 2018

(51) Int. Cl.
*B32B 9/00*    (2006.01)
*C01B 32/198*  (2017.01)
(Continued)

(52) U.S. Cl.
CPC .......... *C01B 32/198* (2017.08); *C01B 32/182* (2017.08); *C01B 32/186* (2017.08);
(Continued)

(58) Field of Classification Search
CPC ....... B32B 9/007; Y10T 428/30; B82Y 30/00; B82Y 40/00
(Continued)

(56) References Cited

U.S. PATENT DOCUMENTS 4,483,700 A   11/1984   Forker, Jr. et al.
5,674,790 A   10/1997   Araujo
(Continued)

FOREIGN PATENT DOCUMENTS

CN    102260858 A    11/2011
CN    102910614 A     2/2013

OTHER PUBLICATIONS

Bianco et al; "Exploring and Rationalising Effective N-Doping of Large Area CVD-Graphene by NH3"; Phys. Chem. Chem. Phys, 2014, 16, pp. 3632-3639.
(Continued)

*Primary Examiner* — Daniel H Miller
(74) *Attorney, Agent, or Firm* — Svetlana Z. Short (57) ABSTRACT

Disclosed herein are methods for forming a graphene film on a substrate, the methods comprising depositing graphene on a surface of the substrate by a first vapor deposition step to form a discontinuous graphene crystal layer; depositing a graphene oxide layer on the discontinuous graphene crystal layer to form a composite layer; and depositing graphene on the composite layer by a second vapor deposition step, wherein the graphene oxide layer is substantially reduced to a graphene layer during the second vapor deposition step. Transparent coated substrates comprising such graphene
(Continued)

films are also disclosed herein, wherein the graphene films have a resistance of less than about 10 KΩ/sq.

6 Claims, 1 Drawing Sheet

(51) Int. Cl.
    *C23C 16/26*     (2006.01)
    *C01B 32/186*     (2017.01)
    *C01B 32/182*     (2017.01)
    *C03C 17/22*     (2006.01)
    *C23C 16/50*     (2006.01)

(52) U.S. Cl.
    CPC .............. *C03C 17/22* (2013.01); *C23C 16/26* (2013.01); *C03C 2217/28* (2013.01); *C03C 2217/40* (2013.01); *C03C 2217/70* (2013.01); *C03C 2218/111* (2013.01); *C03C 2218/153* (2013.01); *C23C 16/50* (2013.01)

(58) Field of Classification Search
    USPC ........................................................ 428/408
    See application file for complete search history.

(56) References Cited

U.S. PATENT DOCUMENTS

| | | |
|---|---|---|
| 7,666,511 B2 | 2/2010 | Ellison et al. |
| 2002/0167800 A1* | 11/2002 | Smalc ................. H01L 23/3672 361/710 |
| 2007/0284557 A1* | 12/2007 | Gruner ................... B82Y 40/00 252/500 |
| 2012/0121891 A1* | 5/2012 | Kim ....................... B82Y 10/00 428/323 |
| 2013/0022813 A1 | 1/2013 | Tang et al. |
| 2017/0047139 A1* | 2/2017 | Al-Ghamdi ........... C23C 14/325 |

OTHER PUBLICATIONS

International Search Report and Written Opinion of the International Searching Authority; PCT/US2016/065798; dated Feb. 21, 2017; 13 Pages; European Patent Office.

Jingfeng et al; "Complete Coverage of Reduced Graphene Oxide on Silicon Dioxide Substrates"; Chin. Phys. B; vol. 23, No. 8; (2014) pp. 088104-1-088104-4.

Ma et al; "Copper-Assisted Direct Growth of Vertical Graphene Nanosheets on Glass Substrates by Low-Temperature Plasma-Enhanced Chemical Vapour Deposition Process"; Nanoscale Research Letters, (2015) 10: 308; 8 Pages.

Medina et al; "Metal-Free Growth of Nanographene on Silicon Oxides for Transparent Conducting Applications"; Adv. Funct. Mater.; 2012, 22, pp. 2123-2128.

Yang et al; "Direct PECVD Growth of Vertically Erected Graphene Walls on Dielectric Substrates as Excellent Multifunctional Electrodes"; J. Mater. Chem. A, 2013, 1, pp. 770-775.

\* cited by examiner

METHOD FOR PRODUCING A GRAPHENE FILM

CROSS-REFERENCE TO RELATED APPLICATIONS

This application claims the benefit of priority under 35 U.S.C § 365 of International Patent Application Serial No. PCT/US2016/065798 filed on Dec. 9, 2016 designating the United States of America, the content of which is relied upon and incorporated herein by, reference in its entirety, which in turn claims the benefit of priority under 35 U.S.C. § 119 of Chinese Patent Application Serial No. 201510941214.3 filed on Dec. 15, 2015, the content of which is relied upon and incorporated herein by reference in its entirety.

FIELD OF THE DISCLOSURE

The disclosure relates generally to glass substrates comprising conductive films, and more particularly to transparent glass substrates comprising conductive graphene films and methods for making the same.

BACKGROUND

Graphene, a two-dimensional carbon material, can be useful in a wide variety of applications due to desirable properties such as chemical stability, mechanical strength, flexibility, transmittance, and electrical conductivity. For example, graphene can potentially be used to replace conductive oxide films, e.g., indium tin oxide (ITO), in various devices such as displays or solar cells. Certain applications call for transparent substrates coated with conductive films such as ITO or graphene, e.g., organic light-emitting diodes (OLEDs). Currently, chemical vapor deposition (CVD) is used to grow high quality graphene to produce transparent films on substrates. However, traditional thermal CVD utilizes a catalyst, such as Cu or Ni, and often requires additional steps such as post-transfer or catalyst removal steps. The complex CVD process may thus result in wrinkles, holes, and/or metal etching residues on the coated substrate, which may complicate subsequent applications.

Additionally, CVD methods often require high temperatures, e.g., above 1100° C., making the CVD process unsuitable for glass substrates with lower glass transition temperatures. Plasma-enhanced CVD (PECVD) methods have been developed for lower temperature graphene deposition. However, PECVD methods tend to produce poor quality graphene films that grow perpendicular to, rather than parallel with, the substrate surface. As individual graphene grains meet each other during the PECVD growth phase, it is believed that the edges of each grain curve upward and start to grow vertically as graphene walls. Such vertical growth can be undesirable as the walls can reduce transparency and/or reduce the conductivity of the graphene film. Vertical walls can form from two grains that meet each other during growth, these grains each comprising about 1-3 layers of graphene. The walls formed from such growth patterns would thus have double the thickness of the individual grains (e.g., 2-6 layers). These thicker grain boundary walls can have higher electrical resistance and lower transmittance while not contributing to the in-plane conductivity of the graphene film.

Accordingly, it would be advantageous to provide methods for depositing graphene films having high transmittance and/or conductivity on transparent substrates. It would also be advantageous to provide transparent, conductive substrates comprising such graphene films for use, e.g., in display devices (such as OLED displays).

SUMMARY

The disclosure relates, in various embodiments, to methods for forming a graphene film on a substrate, the methods comprising depositing graphene on a surface of the substrate by a first vapor deposition step to form a discontinuous graphene crystal layer; depositing a graphene oxide layer on the discontinuous graphene crystal layer to form a composite layer; and depositing graphene on the composite layer by a second vapor deposition step, wherein the graphene oxide layer is substantially reduced to a graphene layer during the second vapor deposition step.

According to various embodiments, the substrate can be chosen from glass substrates, glass-ceramic substrates, or crystalline substrates such as sapphire. The vapor deposition can comprise plasma-enhanced chemical vapor deposition (PECVD). The substrate can be contacted with one or more plasma gases during PECVD, including hydrogen and carbon-source gases. In some embodiments, PECVD can take place in a chamber heated to about 500° C.-1100° C., optionally under vacuum, and under an applied RF electric field at a power ranging from about 50-200 W. The substrate can, for example, be held in the PECVD chamber under such conditions for a growth time ranging from about 5 minutes to about 30 minutes. Graphene oxide can be deposited on the substrate by dip coating, spin coating, slot coating or like techniques. For example, a suspension of graphene oxide in one or more solvents can be used to dip coat the substrate. The graphene oxide can, in some embodiments, have a thickness of one to three layers, e.g., from about 0.3 nm to about 30 nm.

Also disclosed herein are coated substrates comprising a graphene film on at least one surface, wherein the coated substrate is substantially transparent, wherein the graphene film has a resistance of less than about 10 KΩ/sq, and wherein the graphene film comprises at least one multi-layer horizontal graphene sheet and at least one single-layer vertical graphene sheet. The graphene film can have, for instance, a transmittance of at least about 80% in the visible light spectrum (400-700 nm) and/or a resistance of less than about 3 KΩ/sq. A thickness of the graphene film can range from about 1 nm to about 200 nm.

Further disclosed herein are coated glass substrates comprising a graphene film on at least one surface, wherein the coated glass substrate is substantially transparent, wherein the graphene film has a resistance of less than about 10 KΩ/sq, and wherein the glass substrate has a $T_g$ of less than about 1100° C. According to various embodiments, the glass substrate can have a thickness of less than about 3 mm.

Additional features and advantages of the disclosure will be set forth in the detailed description which follows, and in part will be readily apparent to those skilled in the art from that description or recognized by practicing the methods as described herein, including the detailed description which follows, the claims, as well as the appended drawings.

It is to be understood that both the foregoing general description and the following detailed description present various embodiments of the disclosure, and are intended to provide an overview or framework for understanding the nature and character of the claims. The accompanying drawings are included to provide a further understanding of the disclosure, and are incorporated into and constitute a part of this specification. The drawings illustrate various embodiments of the disclosure and together with the description serve to explain the principles and operations of the disclosure.

BRIEF DESCRIPTION OF THE DRAWINGS

The following detailed description can be further understood when read in conjunction with the following drawings.

DETAILED DESCRIPTION

Methods

Disclosed herein are methods for forming a graphene film on a substrate, the methods comprising depositing graphene on a surface of the substrate by a first vapor deposition step to form a discontinuous graphene crystal layer; depositing a graphene oxide layer on the discontinuous graphene crystal layer to form a composite layer; and depositing graphene on the composite layer by a second vapor deposition step, wherein the graphene oxide layer is substantially reduced to a graphene layer during the second vapor deposition step.

Figure 1:
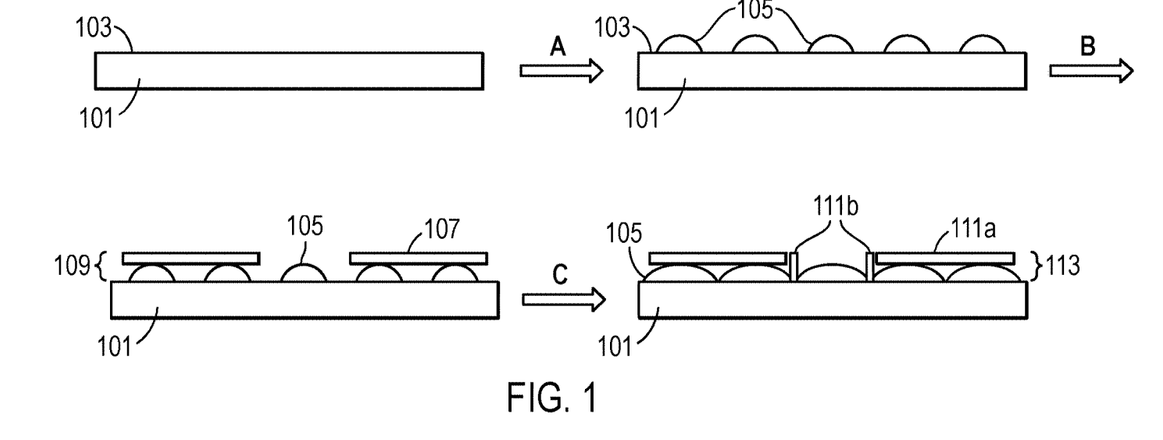
FIG. 1 illustrates graphene growth on a substrate via interrupted PECVD according to various embodiments of the disclosure.

Methods disclosed herein will generally be discussed with reference to FIG. 1, which illustrates various steps for graphene growth on a substrate via interrupted PECVD according to non-limiting embodiments of the disclosure. The following general description is intended to provide an overview of the claimed methods and substrates. Various aspects will be more specifically discussed throughout the disclosure with reference to the non-limiting embodiments, these embodiments being interchangeable with one another within the context of the disclosure As illustrated in FIG. 1, in step A, a first surface 103 of a substrate 101 can be seeded with individual or isolated graphene crystals 105, e.g., by PECVD. The first PECVD step A can comprise graphene growth which can be interrupted before the individual crystal seeds meet each other. For example, the first PECVD step can comprise placing the substrate 101 in a PECVD chamber or apparatus (e.g., the apparatus illustrated in FIG. 2). Hydrogen gas ($H_2$) can be introduced into the chamber, which may be under vacuum, at a rate ranging, for instance, from 0 to about 40 sccm, such as from about 1 sccm to about 35 sccm, from about 5 sccm to about 30 sccm, from about 10 sccm to about 25 sccm, or from about 15 sccm to about 20 sccm, including all ranges and subranges therebetween. The substrate can be heated to a deposition temperature, for example, ranging from about 500° C. to about 1100° C., such as from about 600° C. to about 1050° C., from about 700° C. to about 1000° C., or from about 800° C. to about 900° C., including all ranges and subranges therebetween. The heating ramp rate can range, in some embodiments, from about 1° C./min to about 50° C./min, such as from about 5° C./min to about 40° C./min, from about 10° C./min to about 35° C./min, from about 15° C./min to about 30° C./min, or from about 20° C./min to about 25° C./min, including all ranges and subranges therebetween.

Plasma can be generated within the PECVD chamber using various methods, for example, using dielectric current (RF), direct current (DC), or microwaves (MW), and combinations thereof. Plasma generated using RF can include, for example, inductively coupled plasma (ICP) or capacitively coupled plasma (CCP). In some embodiments, RF power can range from about 50 W to about 200 W, such as from about 75 W to about 175 W, or from about 100 W to about 150 W, including all ranges and subranges therebetween. Before, during, and/or after application of RF current to the PECVD chamber, at least one carbon-source gas (such as $CH_4$, $C_2H_2$, $C_2F_6$, $CHF_3$, or $CF_4$, to name a few) can be introduced into the chamber to induce graphene growth. The carbon-source gas flow rate can range, for example, from about 1 sccm to about 20 sccm, such as from about 2 sccm to about 18 sccm, from about 3 sccm to about 15 sccm, from about 4 sccm to about 12 sccm, from about 5 sccm to about 10 sccm, or from about 6 sccm to about 8 sccm, including all ranges and subranges therebetween.

As previously discussed, the first growth time (e.g., residence time during which the substrate is in contact with the plasma during step A) can be selected such that individual graphene crystal seeds 105 are formed on the first surface 103 of the substrate 101, but do not meet or touch each other. In some embodiments, the first growth time can be selected such that the individual graphene crystal seed edges are separated from each other by a distance approximately equal to the thickness of one graphene layer, e.g., from about 0.3 nm to about 10 nm, such as about 0.3, 0.35, 0.4, 0.5, 0.6, 0.7, 0.8, 0.9, 1, 2, 3, 4, 5, 6, 7, 8, 9, or 10 nm, including all ranges and subranges therebetween. According to additional embodiments, the graphene crystal seeds 105 can be separated by a distance approximately equal to the thickness of one atomic layer, such as ranging from about 0.3 nm to about 0.5 nm, or from about 0.35 nm to about 0.4 nm, including all ranges and subranges therebetween.

The first growth time can range, in certain embodiments, from about 1 minute to about 15 minutes, such as from about 2 minutes to about 12 minutes, from about 3 minutes to about 10 minutes, from about 4 minutes to about 8 minutes, or from about 5 minutes to about 6 minutes, including all ranges and subranges therebetween. The graphene crystal seeds produced during the first growth step may have a size, e.g., diameter, ranging from about 1 nm to about 10 nm, such as from about 2 nm to about 9 nm, from about 3 nm to about 8 nm, from about 4 nm to about 7 nm, or from about 5 nm to about 6 nm, including all ranges and subranges therebetween.

While FIG. 1 illustrates graphene crystal seeds 105 grown only on the first surface 103 of the substrate 101, it is to be understood that graphene crystal seeds can be formed on one or both surfaces of the substrate 101 if desired. Moreover, while the graphene crystal seeds 105 are illustrated as substantially evenly spaced apart, it is to be understood that each crystal seed can be spaced apart from adjacent crystal seeds by varying distances, e.g., depending on the growth conditions in the PECVD chamber.

Referring again to FIG. 1, the PECVD process is interrupted by step B, in which graphene oxide sheets 107 are deposited on the first surface 103 to connect the individual graphene seeds 105. A composite layer 109 comprising graphene crystal seeds 105 interconnected by graphene oxide sheets 107 can thus be formed on the first surface 103 of the substrate 101. The graphene oxide sheets 107 can have a thickness, for example, ranging from 1-3 layers, such as from about 0.3 nm to about 30 nm, from about 0.35 nm to about 25 nm, from about 0.4 nm to about 20 nm, from about 0.5 nm to about 15 nm, from about 0.7 nm to about 12 nm, from about 1 nm to about 10 nm, from about 2 nm to about 9 nm, from about 3 nm to about 8 nm, from about 4 nm to about 7 nm, or from about 5 nm to about 6 nm, including all ranges and subranges therebetween. The graphene oxide sheets 107 can be deposited on the substrate using any suitable means known in the art, such as dip coating, slot coating, or spin coating.

For example, a solution, suspension, or dispersion of graphene oxide sheets can be prepared using one or more solvents. Exemplary solvents can include aqueous and organic solvents, such as water, deionized water, acetone, methanol, ethanol, propanol, ethylene glycol, dimethyl sulfoxide (DMSO), N,N-dimethylformamide (DMF), N-methyl-2-pyrrolidone (NMP), pyridine, tetrahydrofuran (THF), dichloromethane, xylene, hexane, and combinations thereof. Such solutions, suspensions, or dispersions can be stable for a period of several hours to several days or more depending, e.g., on the choice of solvent(s). Exemplary graphene oxide concentrations can range, for instance, from about 0.1 to about 1 mg/mL, such as from about 0.2 to about 0.9 mg/mL, from about 0.3 to about 0.8 mg/mL, from about 0.4 to about 0.7 mg/mL, or from about 0.5 to about 0.6 mg/mL, including all ranges and subranges therebetween. In the case of dip coating, the pulling rate can vary depending, e.g., on the graphite oxide concentration, layer thickness, and/or solvent. According to various embodiments, the pulling rate can range from about 2 mm/min to about 50 mm/min, such as from about 3 mm/min to about 40 mm/min, from about 5 mm/min to about 30 mm/min, from about 10 mm/min to about 25 mm/min, or from about 15 mm/min to about 20 mm/min, including all ranges and subranges therebetween.

With reference made to FIG. 1, in step C, the PECVD process is continued and the graphene oxide coated substrate 101 can be reintroduced into the PECVD chamber for additional graphene growth. During step C, the graphene oxide sheets 107 can be substantially reduced to graphene sheets 111a and additional graphene growth or re-growth may take place to repair any defects and/or improve connection between the graphene crystal seeds 105. Step C can, in some embodiments, be carried out using the same apparatus and/or parameters described above (and below) with respect to step A.

Figure 2:
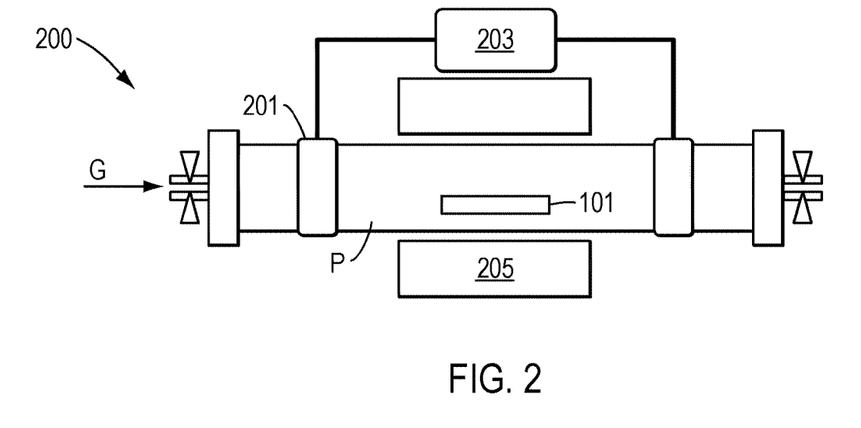
FIG. 2 depicts an exemplary apparatus for PECVD of graphene on a substrate according to certain embodiments of the disclosure.

For example, the second PECVD step can comprise placing the substrate 101 in a PECVD chamber or apparatus (e.g., the apparatus illustrated in FIG. 2). Hydrogen gas ($H_2$) can be introduced into the chamber, which may be under vacuum, at a rate ranging, for instance, from 0 to about 40 sccm, including all ranges and subranges provided above with respect to step A. The sample can be heated to a deposition temperature, for example, ranging from about 500° C. to about 1100° C., including all ranges and subranges provided above. The heating ramp rate can range, in some embodiments, from about 1° C./min to about 50° C./min, including all ranges and subranges provided above. In some embodiments, RF power can range from about 50 W to about 200 W, including all ranges and subranges provided above. Before, during, and/or after application of RF current to the PECVD chamber, at least one carbon-source gas can be introduced into the chamber to induce graphene growth. The carbon-source gas flow rate can range, for example, from about 1 sccm to about 20 sccm, including all ranges and subranges provided above. In certain embodiments, the $H_2$ and/or carbon-source gas can reduce the graphene oxide sheets to graphene and/or promote additional graphene growth for repair and/or restructuring of the resulting graphene layer 113.

The second growth time (e.g., residence time during step C) can be selected such that the graphene oxide sheets are substantially reduced to graphene sheets and/or such that any repair or connection between graphene crystals can be achieved through new graphene crystal growth or re-growth. The second growth time can range, in certain embodiments, from about 1 minute to about 30 minutes, such as from about 2 minutes to about 25 minutes, from about 3 minutes to about 20 minutes, from about 4 minutes to about 15 minutes, or from about 5 minutes to about 10 minutes, including all ranges and subranges therebetween.

Without wishing to be bound by theory, it is believed that the graphene film 113 thus formed, in which the graphene grains 105 are overlap-connected by horizontally-oriented graphene sheets 111a, can prevent the connection of the graphene grains by multi-layer walls. Instead, vertically-oriented graphene walls (or sheets) 111b between the graphene crystals can be formed during the second deposition step to produce thinner, e.g., single layer walls. For instance, the graphene walls 111b can have a thickness ranging from about 0.3 nm to about 10 nm, such as from about 0.35 nm to about 9 nm, from about 0.4 nm to about 8 nm, from about 0.5 to about 7 nm, from about 0.6 nm to about 6 nm, from about 0.7 nm to about 5 nm, from about 0.8 nm to about 4 nm, from about 0.9 nm to about 3 nm, or from about 1 nm to about 2 nm, including all ranges and subranges therebetween. In various embodiments, the single-layer vertical walls 111b can have a thickness of one atomic layer (e.g., about 0.35 nm). Single-layer vertical walls 111b can have lower resistance and/or higher transparency as compared to multi-layer vertical walls formed using prior art processes.

During step C, the graphene oxide sheets 107 can be substantially reduced to graphene sheets 111a by the $H_2$ or carbon-source (e.g., $CH_4$) plasma gases and the graphene seeds 105 can serve as growth sites for further graphene film growth. As illustrated, the graphene seeds 105 can grow closer together without forming multi-layer vertical walls due to the overlap connection via horizontal graphene sheets 111a. It is believed that this reduction, re-growth, and repair process can promote the formation of a more continuous graphene film on the substrate. According to various embodiments, the horizontal graphene sheets 111a can comprise from 3 to 20 graphene layers, or more, such as 4, 5, 6, 7, 8, 9, 10, 11, 12, 13, 14, 15, 16, 17, 18, 19, 20, or more layers. In additional embodiments, the graphene film 113 can have an overall thickness ranging, for example, from about 1 nm to about 200 nm, such as from about 2 nm to about 175 nm, from about 3 nm to about 150 nm, from about 4 nm to about 125 nm, from about 5 nm to about 100 nm, from about 6 nm to about 75 nm, from about 7 nm to about 50 nm, from about 8 nm to about 25 nm, or from about 9 nm to about 10 nm, including all ranges and subranges therebetween.

While FIG. 1 illustrates graphene sheets 111a each overlapping two graphene crystals 105, it is to be understood that the graphene sheets can overlap more than two crystals. Moreover, while FIG. 1 illustrates a single (not covered) graphene crystal 105 between graphene crystals 105 that are overlapped by graphene sheets 111a, it is to be understood that more than one graphene crystal can be overlapped or not overlapped by the graphene sheets 111a depending, e.g., on the growth conditions in the PECVD chamber.

According to various embodiments, the methods disclosed herein can include additional optional steps that can be carried out before and/or after deposition of the graphene film on the substrate. For instance, before deposition (e.g., before step A), the substrate can be optionally cleaned, e.g., using water and/or acidic or basic solutions. In some embodiments, the substrate can be cleaned using water, a solution of $H_2SO_4$ and/or $H_2O_2$, and/or a solution of $NH_4OH$ and/or $H_2O_2$. The substrates can, for example, be rinsed with the solutions or washed for a period of time ranging from about 1 minute to about 10 minutes, such as from about 2 minutes to about 8 minutes, from about 3 minutes to about 6 minutes, or from about 4 minutes to about 5 minutes, including all ranges and subranges therebetween. Ultrasonic energy can be applied during the cleaning step in some embodiments. The cleaning step can be carried out at ambient or elevated temperatures, e.g., temperatures ranging from about 25° C. to about 150° C., such as from about 50° C. to about 125° C., from about 65° C. to about 100° C., or from about 75° C. to about 95° C., including all ranges and subranges therebetween. Other additional optional steps can include, for example, cutting, polishing, grinding, and/or edge-finishing of the substrate, to name a few.

FIG. 2 depicts a PECVD chamber or apparatus 200 suitable for carrying out the methods disclosed herein according to various exemplary embodiments. An RF coil 201 may be disposed around at least a portion of the chamber 200 and attached to an RF plasma generator 203 by way of an RF plasma matchwork (not illustrated). The RF plasma generator 203 and coil 201 serve to convert the gas(es) G entering the chamber 200 into a plasma P. A heating unit 205 can also be disposed around or otherwise connected to the chamber 200 for heating the substrate 101 and/or gas(es) G within the chamber. As discussed above, the gas G can comprise $H_2$ and carbon-source gases such as $CH_4$. In some embodiments, additional gases, such as inert or noble gases, can also be introduced into the chamber, e.g., argon, nitrogen, and the like. Flow rates for such additional gases can likewise range from 0 sccm to about 40 sccm, such as from about 5 sccm to about 30 sccm, or from about 10 to about 20 sccm, including all ranges and subranges therebetween.

Substrates

Disclosed herein are coated substrates comprising a graphene film on at least one surface, wherein the coated substrates are substantially transparent, wherein the graphene film has a resistance of less than about 10 KΩ/sq, and wherein the graphene film comprises at least one multi-layer horizontal graphene sheet and at least one single-layer vertical graphene sheet. Also disclosed herein are coated glass substrates comprising a graphene film on at least one surface, wherein the coated glass substrates are substantially transparent, wherein the graphene film has a resistance of less than about 10 KΩ/sq, and wherein the glass substrate has a glass transition temperature ($T_g$) of less than about 1100° C.

Materials suitable for use as substrates in the methods and/or products disclosed herein can include any desired material, such as transparent or non-transparent materials, e.g., glass, glass-ceramic, crystalline materials such as sapphire, plastics, polymers, metals, and the like. In at least one non-limiting embodiment, the substrate is a glass substrate. Exemplary glass substrates can comprise, for example, any glass known in the art that is suitable for graphene deposition and/or display devices including, but not limited to, aluminosilicate, alkali-aluminosilicate, borosilicate, alkali-borosilicate, aluminoborosilicate, alkali-aluminoborosilicate, soda lime silicate, and other suitable glasses. In certain embodiments, the substrate may have a thickness of less than or equal to about 3 mm, for example, ranging from about 0.1 mm to about 2.5 mm, from about 0.3 mm to about 2 mm, from about 0.7 mm to about 1.5 mm, or from about 1 mm to about 1.2 mm, including all ranges and subranges therebetween. Non-limiting examples of commercially available glasses suitable for use as a light filter include, for instance, EAGLE XG®, Iris™, Lotus™, Gorilla®, HPFS®, and ULE® glasses from Corning Incorporated. Suitable glasses are disclosed, for example, in U.S. Pat. Nos. 4,483,700, 5,674,790, and 7,666,511, which are incorporated herein by reference in their entireties, which are incorporated herein by reference in their entireties.

The substrate can, in various embodiments, be transparent or substantially transparent before and/or after coating with the graphene film. As used herein, the term "transparent" is intended to denote that the substrate, at a thickness of approximately 1 mm, has a transmission of greater than about 70% in the visible region of the spectrum (400-700 nm). For instance, an exemplary transparent substrate or coated substrate may have greater than about 75% transmittance in the visible light range, such as greater than about 80%, greater than about 85%, greater than about 90%, greater than about 95%, or greater than about 99% transmittance, including all ranges and subranges therebetween. In certain embodiments, an exemplary substrate or coated substrate may have a transmittance of greater than about 50% in the ultraviolet (UV) region (100-400 nm), such as greater than about 55%, greater than about 60%, greater than about 65%, greater than about 70%, greater than about 75%, greater than about 80%, greater than about 85%, greater than about 90%, greater than about 95%, or greater than about 99% transmittance, including all ranges and subranges therebetween.

The substrate can comprise a glass sheet having a first surface and an opposing second surface. The surfaces may, in certain embodiments, be planar or substantially planar, e.g., substantially flat and/or level. The substrate can also, in some embodiments, be curved about at least one radius of curvature, e.g., a three-dimensional substrate, such as a convex or concave substrate. The first and second surfaces may, in various embodiments, be parallel or substantially parallel. The substrate may further comprise at least one edge, for instance, at least two edges, at least three edges, or at least four edges. By way of a non-limiting example, the substrate may comprise a rectangular or square sheet having four edges, although other shapes and configurations are envisioned and are intended to fall within the scope of the disclosure.

The graphene film deposited on the substrate can have any desired thickness, e.g., ranging from a few to several layers of graphene. In some embodiments, the graphene film can comprise two or more layers, such as 3, 4, 5, 6, 7, 8, 9, 10, 15, 20, or more layers. The thickness of an individual graphene layer can range, for example, from about 0.3 nm to about 10 nm, such as from about 0.35 nm to about 9 nm, from about 0.4 nm to about 8 nm, from about 0.5 nm to about 7 nm, from about 0.6 nm to about 6 nm, from about 0.7 nm to about 5 nm, from about 0.8 nm to about 4 nm, from about 0.9 nm to about 3 nm, or from about 1 nm to about 2 nm, including all ranges and subranges therebetween. The overall thickness of the graphene film can range, for example, from about 1 nm to about 200 nm, such as from about 2 nm to about 175 nm, from about 3 nm to about 150 nm, from about 4 nm to about 125 nm, from about 5 nm to about 100 nm, from about 6 nm to about 75 nm, from about 7 nm to about 50 nm, from about 8 nm to about 25 nm, or from about 9 nm to about 10 nm, including all ranges and subranges therebetween. According to various embodiments, the resistance of the graphene film can be less than about 10 KΩ/sq, such as less than about 9 KΩ/sq, less than about 8 KΩ/sq, less than about 7 KΩ/sq, less than about 6 KΩ/sq, less than about 5 KΩ/sq, less than about 4 KΩ/sq, less than about 3 KΩ/sq, less than about 2 KΩ/sq, or less than about 1 KΩ/sq, (e.g., less than about 9.5, 8.5, 7.5, 6.5, 5.5, 4.5, 3.5, 2.5, 1.5, or 0.5 KΩ/sq) including all ranges and subranges therebetween.

A "coated substrate" as used herein is intended to refer to a substrate comprising a graphene film on at least one surface. The graphene film can comprise, in some embodiments, vertically-oriented sheets (or vertical walls) and horizontally-oriented sheets. As used herein, the term "vertical" is intended to denote a sheet or layer that is substantially perpendicular to the substrate surface on which the graphene film is deposited, while "horizontal" is intended to denote a sheet or layer that is substantially parallel to the surface on which the graphene film is deposited. As used herein, the term "sheet" is intended to denote graphene comprising at least one layer, e.g., from 1 to 20 layers or more. Sheets can be single-layer (e.g., about 0.3-10 nm thick) or multi-layer (e.g., [x*t] nm thick, where x is the number of layers and t is the layer thickness). The vertical walls can be single-layer sheets extending from the surface in a substantially perpendicular direction with respect to the surface. The multi-layer horizontal sheets can, in some embodiments, be interrupted by one or more single-layer vertical sheets, these vertical sheets substantially preventing adjoining graphene crystals from meeting together during growth to form multi-layer vertical walls.

According to various embodiments, the vertical walls can have a thickness of one graphene layer, e.g., from about 0.3 nm to about 10 nm, such as from about 0.35 nm to about 9 nm, from about 0.4 nm to about 8 nm, from about 0.5 nm to about 7 nm, from about 0.6 nm to about 6 nm, from about 0.5 nm to about 7 nm, from about 0.6 nm to about 6 nm, from about 0.7 nm to about 5 nm, from about 0.8 nm to about 4 nm, from about 0.9 nm to about 3 nm, or from about 1 nm to about 2 nm, including all ranges and subranges therebetween. In some embodiments, the vertical walls can have a thickness of one atomic layer, e.g., from about 0.3 nm to about 0.5 nm, such as from about 0.35 nm to about 0.4 nm, including all ranges and subranges therebetween. The height of the vertical wall (e.g., the distance it extends from the substrate surface) can be substantially equal to the thickness of the overall graphene film, e.g., ranging from about 1 nm to about 200 nm, such as from about 2 nm to about 175 nm, from about 3 nm to about 150 nm, from about 4 nm to about 125 nm, from about 5 nm to about 100 nm, from about 6 nm to about 75 nm, from about 7 nm to about 50 nm, from about 8 nm to about 25 nm, or from about 9 nm to about 10 nm, including all ranges and subranges therebetween. Similarly, the horizontally-oriented sheets can have a thickness ranging from 3 to 20 layers or more, such as from about 1 nm to about 200 nm, from about 2 nm to about 175 nm, from about 3 nm to about 150 nm, from about 4 nm to about 125 nm, from about 5 nm to about 100 nm, from about 6 nm to about 75 nm, from about 7 nm to about 50 nm, from about 8 nm to about 25 nm, or from about 9 nm to about 10 nm, including all ranges and subranges therebetween.

It will be appreciated that the various disclosed embodiments may involve particular features, elements or steps that are described in connection with that particular embodiment. It will also be appreciated that a particular feature, element or step, although described in relation to one particular embodiment, may be interchanged or combined with alternate embodiments in various non-illustrated combinations or permutations.

It is also to be understood that, as used herein the terms "the," "a," or "an," mean "at least one," and should not be limited to "only one" unless explicitly indicated to the contrary. Thus, for example, reference to "a layer" includes examples having two or more such layers unless the context clearly indicates otherwise. Likewise, a "plurality" is intended to denote "more than one." As such, a "plurality of layers" includes two or more such layers, such as three or more such layers, etc.

Ranges can be expressed herein as from "about" one particular value, and/or to "about" another particular value. When such a range is expressed, examples include from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

The terms "substantial," "substantially," and variations thereof as used herein are intended to note that a described feature is equal or approximately equal to a value or description. For example, a "substantially planar" surface is intended to denote a surface that is planar or approximately planar. Moreover, as defined above, "substantially similar" is intended to denote that two values are equal or approximately equal. In some embodiments, "substantially similar" may denote values within about 10% of each other, such as within about 5% of each other, or within about 2% of each other.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a method that comprises A+B+C include embodiments where a method consists of A+B+C and embodiments where a method consists essentially of A+B+C.

It will be apparent to those skilled in the art that various modifications and variations can be made to the present disclosure without departing from the spirit and scope of the disclosure. Since modifications combinations, sub-combinations and variations of the disclosed embodiments incorporating the spirit and substance of the disclosure may occur to persons skilled in the art, the disclosure should be construed to include everything within the scope of the appended claims and their equivalents.

The following Examples are intended to be non-restrictive and illustrative only, with the scope of the invention being defined by the claims.

EXAMPLES

Glass substrates (Corning HPFS® or Lotus™) comprising graphene films were prepared according to the following methods. The glass substrates were pre-washed in (96% wt)$H_2SO_4$/(30% wt)$H_2O_2$ (4:1) mixture at 95° C. for 5 minutes, then washed in a deionized water/(28% wt)$NH_4OH$/(30% wt)$H_2O_2$ (40:1:2) mixture at 65° C. for 5 minutes, and finally rinsed with deionized water and dried for use. The optical transmittance characteristics of the glass substrates were determined via a UV-Vis-NIR diffuse reactance spectrum in a spectrophotometer (Hitachi U-4100). The sheet resistances of the graphene films were measured by the Van der Pauw method with an Accent HL5500.

Example 1

An HPFS® glass substrate was placed in a PECVD chamber and 20 sccm $H_2$ was introduced into the chamber under high vacuum conditions. The substrate was heated up to 900° C. using a ramp rate of 10° C./min. RF power was set to 150 W and 5 sccm $CH_4$ was introduced into the chamber. After a first growth time of 10 minutes, the substrate (comprising graphene crystal seeds) was removed from the chamber. 0.1 mg/mL graphene oxide (thickness=1-3 layers) solution was dip coated on the graphene crystal seeds to form a continuous graphene oxide coated graphene composite layer on the substrate surface. A pulling rate of 20 mm/min was employed. The substrate was placed back in the PECVD chamber and 20 sccm $H_2$ was introduced into the chamber under high vacuum conditions. The substrate was heated up to 900° C. using a ramp rate of 10° C./min. RF power was set to 150 W and 5 sccm $CH_4$ was introduced into the chamber. After a second growth time of 20 minutes, the substrate was removed from the chamber and analyzed. The graphene film had a transmittance of 85% and a resistance of 1.96 KΩ/sq.

Example 2

An HPFS® glass substrate was placed in a PECVD chamber and 8 sccm $H_2$ was introduced into the chamber under high vacuum conditions. The substrate was heated up to 900° C. using a ramp rate of 10° C./min. RF power was set to 200 W and 2 sccm $CH_4$ was introduced into the chamber. After a first growth time of 10 minutes, the substrate (comprising graphene crystal seeds) was removed from the chamber. 0.1 mg/mL graphene oxide (thickness=1-3 layers) solution was dip coated on the graphene crystal seeds to form a continuous graphene oxide coated graphene composite layer on the substrate surface. A pulling rate of 2 mm/min was employed. The substrate was placed back in the PECVD chamber and 8 sccm $H_2$ was introduced into the chamber under high vacuum conditions. The substrate was heated up to 900° C. using a ramp rate of 10° C./min. RF power was set to 200 W and 2 sccm $CH_4$ was introduced into the chamber. After a second growth time of 15 minutes, the substrate was removed from the chamber and analyzed. The graphene film had a transmittance of 82% and a resistance of 1.78 KΩ/sq.

Example 3

An HPFS® glass substrate was placed in a PECVD chamber and 5 sccm $H_2$ was introduced into the chamber under high vacuum conditions. The substrate was heated up to 900° C. using a ramp rate of 10° C./min. RF power was set to 200 W and 1 sccm $CH_4$ was introduced into the chamber. After a first growth time of 15 minutes, the substrate (comprising graphene crystal seeds) was removed from the chamber. 0.1 mg/mL graphene oxide (thickness=1-3 layers) solution was dip coated on the graphene crystal seeds to form a continuous graphene oxide coated graphene composite layer on the substrate surface. A pulling rate of 2 mm/min was employed. The substrate was placed back in the PECVD chamber and 5 sccm $H_2$ was introduced into the chamber under high vacuum conditions. The substrate was heated up to 900° C. using a ramp rate of 10° C./min. RF power was set to 200 W and 1 sccm $CH_4$ was introduced into the chamber. After a second growth time of 10 minutes, the substrate was removed from the chamber and analyzed. The graphene film had a transmittance of 89% and a resistance of 3.12 KΩ/sq.

Example 4

An HPFS® glass substrate was placed in a PECVD chamber and 20 sccm $H_2$ was introduced into the chamber under high vacuum conditions. The substrate was heated up to 1100° C. using a ramp rate of 10° C./min. RF power was set to 150 W and 5 sccm $CH_4$ was introduced into the chamber. After a first growth time of 10 minutes, the substrate (comprising graphene crystal seeds) was removed from the chamber. 0.1 mg/mL graphene oxide (thickness=1-3 layers) solution was dip coated on the graphene crystal seeds to form a continuous graphene oxide coated graphene composite layer on the substrate surface. A pulling rate of 20 mm/min was employed. The substrate was placed back in the PECVD chamber and 20 sccm $H_2$ was introduced into the chamber under high vacuum conditions. The substrate was heated up to 1100° C. using a ramp rate of 10° C./min. RF power was set to 150 W and 5 sccm $CH_4$ was introduced into the chamber. After a second growth time of 20 minutes, the substrate was removed from the chamber and analyzed. The graphene film had a transmittance of 81% and a resistance of 1.56 KΩ/sq.

Example 5

An HPFS® glass substrate was placed in a PECVD chamber and under high vacuum conditions (no $H_2$ was pumped into the chamber). The substrate was heated up to 900° C. using a ramp rate of 10° C./min. RF power was set to 150 W and 5 sccm $CH_4$ was introduced into the chamber. After a first growth time of 10 minutes, the substrate (comprising graphene crystal seeds) was removed from the chamber. 0.1 mg/mL graphene oxide (thickness=1-3 layers) solution was dip coated on the graphene crystal seeds to form a continuous graphene oxide coated graphene composite layer on the substrate surface. A pulling rate of 20 mm/min was employed. The substrate was placed back in the PECVD chamber under high vacuum conditions (no $H_2$ was pumped into the chamber). The substrate was heated up to 900° C. using a ramp rate of 10° C./min. RF power was set to 150 W and 5 sccm $CH_4$ was introduced into the chamber. After a second growth time of 20 minutes, the substrate was removed from the chamber and analyzed. The graphene film had a transmittance of 85% and a resistance of 1.96 KΩ/sq.

Example 6

An HPFS® glass substrate was placed in a PECVD chamber and 40 sccm $H_2$ was introduced into the chamber under high vacuum conditions. The substrate was heated up to 900° C. using a ramp rate of 10° C./min. RF power was set to 150 W and 1 sccm $CH_4$ was introduced into the chamber. After a first growth time of 10 minutes, the substrate (comprising graphene crystal seeds) was removed from the chamber. 0.1 mg/mL graphene oxide (thickness=1-3 layers) solution was dip coated on the graphene crystal seeds to form a continuous graphene oxide coated graphene composite layer on the substrate surface. A pulling rate of 20 mm/min was employed. The substrate was placed back in the PECVD chamber and 40 sccm $H_2$ was introduced into the chamber under high vacuum conditions. The substrate was heated up to 900° C. using a ramp rate of 10° C./min. RF power was set to 200 W and 1 sccm $CH_4$ was introduced into the chamber. After a second growth time of 15 minutes, the substrate was removed from the chamber and analyzed. The graphene film had a transmittance of 92% and a resistance of 9.81 KΩ/sq.

Example 7

An HPFS® glass substrate was placed in a PECVD chamber and 20 sccm $H_2$ was introduced into the chamber under high vacuum conditions. The substrate was heated up to 900° C. using a ramp rate of 10° C./min. RF power was set to 50 W and 5 sccm $CH_4$ was introduced into the chamber. After a first growth time of 10 minutes, the substrate (comprising graphene crystal seeds) was removed from the chamber. 0.1 mg/mL graphene oxide (thickness=1-3 layers) solution was dip coated on the graphene crystal seeds to form a continuous graphene oxide coated graphene composite layer on the substrate surface. A pulling rate of 20 mm/min was employed. The substrate was placed back in the PECVD chamber and 20 sccm $H_2$ was introduced into the chamber under high vacuum conditions. The substrate was heated up to 900° C. using a ramp rate of 10° C./min. RF power was set to 50 W and 5 sccm $CH_4$ was introduced into the chamber. After a second growth time of 20 minutes, the substrate was removed from the chamber and analyzed. The graphene film had a transmittance of 90% and a resistance of KΩ/sq.

Example 8

An HPFS® glass substrate was placed in a PECVD chamber and 8 sccm $H_2$ was introduced into the chamber under high vacuum conditions. The substrate was heated up to 1100° C. using a ramp rate of 10° C./min. RF power was set to 200 W and 2 sccm $CH_4$ was introduced into the chamber. After a first growth time of 15 minutes, the substrate (comprising graphene crystal seeds) was removed from the chamber. 0.1 mg/mL graphene oxide (thickness=1-3 layers) solution was dip coated on the graphene crystal seeds to form a continuous graphene oxide coated graphene composite layer on the substrate surface. A pulling rate of 20 mm/min was employed. The substrate was placed back in the PECVD chamber and 20 sccm $H_2$ was introduced into the chamber under high vacuum conditions. The substrate was heated up to 900° C. using a ramp rate of 10° C./min. RF power was set to 150 W and 5 sccm $CH_4$ was introduced into the chamber. After a second growth time of 20 minutes, the substrate was removed from the chamber and analyzed. The graphene film had a transmittance of 74% and a resistance of 0.93 KΩ/sq.

Example 9

An HPFS® glass substrate was placed in a PECVD chamber and 8 sccm $H_2$ was introduced into the chamber under high vacuum conditions. The substrate was heated up to 900° C. using a ramp rate of 10° C./min. RF power was set to 200 W and 2 sccm $CH_4$ was introduced into the chamber. After a first growth time of 5 minutes, the substrate (comprising graphene crystal seeds) was removed from the chamber. 0.1 mg/mL graphene oxide (thickness=1-3 layers) solution was dip coated on the graphene crystal seeds to form a continuous graphene oxide coated graphene composite layer on the substrate surface. A pulling rate of 20 mm/min was employed. The substrate was placed back in the PECVD chamber and 8 sccm $H_2$ was introduced into the chamber under high vacuum conditions. The substrate was heated up to 900° C. using a ramp rate of 10° C./min. RF power was set to 200 W and 2 sccm $CH_4$ was introduced into the chamber. After a second growth time of 20 minutes, the substrate was removed from the chamber and analyzed. The graphene film had a transmittance of 72% and a resistance of 0.84 KΩ/sq.

Example 10

An HPFS® glass substrate was placed in a PECVD chamber and 8 sccm $H_2$ was introduced into the chamber under high vacuum conditions. The substrate was heated up to 900° C. using a ramp rate of 10° C./min. RF power was set to 200 W and 2 sccm $CH_4$ was introduced into the chamber. After a first growth time of 10 minutes, the substrate (comprising graphene crystal seeds) was removed from the chamber. 0.1 mg/mL graphene oxide (thickness=1-3 layers) solution was dip coated on the graphene crystal seeds to form a continuous graphene oxide coated graphene composite layer on the substrate surface. A pulling rate of 20 mm/min was employed. The substrate was placed back in the PECVD chamber and 8 sccm $H_2$ was introduced into the chamber under high vacuum conditions. The substrate was heated up to 900° C. using a ramp rate of 10° C./min. RF power was set to 200 W and 2 sccm $CH_4$ was introduced into the chamber. After a second growth time of 15 minutes, the substrate was removed from the chamber and analyzed. The graphene film had a transmittance of 80% and a resistance of 1.62 KΩ/sq.

Example 11

An HPFS® glass substrate was placed in a PECVD chamber and 20 sccm $H_2$ was introduced into the chamber under high vacuum conditions. The substrate was heated up to 900° C. using a ramp rate of 10° C./min. RF power was set to 150 W and 20 sccm $CH_4$ was introduced into the chamber. After a first growth time of 10 minutes, the substrate (comprising graphene crystal seeds) was removed from the chamber. 0.1 mg/mL graphene oxide (thickness=1-3 layers) solution was dip coated on the graphene crystal seeds to form a continuous graphene oxide coated graphene composite layer on the substrate surface. A pulling rate of 20 mm/min was employed. The substrate was placed back in the PECVD chamber and 20 sccm $H_2$ was introduced into the chamber under high vacuum conditions. The substrate was heated up to 900° C. using a ramp rate of 10° C./min. RF power was set to 150 W and 20 sccm $CH_4$ was introduced into the chamber. After a second growth time of 20 minutes, the substrate was removed from the chamber and analyzed. The graphene film had a transmittance of 79% and a resistance of 2.13 KΩ/sq.

Example 12

An HPFS® glass substrate was placed in a PECVD chamber and 8 sccm $H_2$ was introduced into the chamber under high vacuum conditions. The substrate was heated up to 900° C. using a ramp rate of 10° C./min. RF power was set to 100 W and 2 sccm $CH_4$ was introduced into the chamber. After a first growth time of 5 minutes, the substrate (comprising graphene crystal seeds) was removed from the chamber. 0.1 mg/mL graphene oxide (thickness=1-3 layers)

solution was dip coated on the graphene crystal seeds to form a continuous graphene oxide coated graphene composite layer on the substrate surface. A pulling rate of 2 mm/min was employed. The substrate was placed back in the PECVD chamber and 8 sccm $H_2$ was introduced into the chamber under high vacuum conditions. The substrate was heated up to 900° C. using a ramp rate of 10° C./min. RF power was set to 100 W and 2 sccm $CH_4$ was introduced into the chamber. After a second growth time of 30 minutes, the substrate was removed from the chamber and analyzed. The graphene film had a transmittance of 87% and a resistance of 2.78 KΩ/sq.

Example 13

A Lotus™ glass substrate was placed in a PECVD chamber and 20 sccm $H_2$ was introduced into the chamber under high vacuum conditions. The substrate was heated up to 900° C. using a ramp rate of 10° C./min. RF power was set to 150 W and 5 sccm $CH_4$ was introduced into the chamber. After a first growth time of 10 minutes, the substrate (comprising graphene crystal seeds) was removed from the chamber. 0.1 mg/mL graphene oxide (thickness=1-3 layers) solution was dip coated on the graphene crystal seeds to form a continuous graphene oxide coated graphene composite layer on the substrate surface. A pulling rate of 20 mm/min was employed. The substrate was placed back in the PECVD chamber and 20 sccm $H_2$ was introduced into the chamber under high vacuum conditions. The substrate was heated up to 900° C. using a ramp rate of 10° C./min. RF power was set to 150 W and 5 sccm $CH_4$ was introduced into the chamber. After a second growth time of 20 minutes, the substrate was removed from the chamber and analyzed. The graphene film had a transmittance of 79% and a resistance of 1.62 KΩ/sq.

Comparative Example 1

An HPFS® glass substrate similar to that used in Example 1 was cleaned in (96% wt)$H_2SO_4$/(30% wt)$H_2O_2$ (4:1) mixture at 95° C. for 5 minutes, then washed in a deionized water/(28% wt)$NH_4OH$/(30% wt)$H_2O_2$ (40:1:2) mixture at 65° C. for 5 minutes, and finally rinsed with deionized water and dried for use. The substrate was then subjected to the same treatment outlined in Example 1, without the intermediate step of dip coating to form a graphene oxide layer before the second growth step.

The substrate was placed in the PECVD chamber and 20 sccm $H_2$ was introduced into the chamber under high vacuum conditions. The substrate was heated up to 900° C. using a ramp rate of 10° C./min. RF power was set to 150 W and 5 sccm $CH_4$ was introduced into the chamber. After a first growth time of 10 minutes, the substrate was removed from the chamber. The substrate was placed back in the PECVD chamber and 20 sccm $H_2$ was introduced into the chamber under high vacuum conditions. The substrate was heated up to 900° C. using a ramp rate of 10° C./min. RF power was set to 150 W and 5 sccm $CH_4$ was introduced into the chamber. After a second growth time of 20 minutes, the substrate was removed from the chamber and analyzed. The graphene film had a transmittance of 85% and a resistance of 3.71 KΩ/sq. As compared to the coated substrate produced in Example 1, the comparative substrate had a higher resistance (nearly two times higher) while exhibiting a similar transmission.

What is claimed is:

1. A coated substrate comprising a graphene film on at least one surface, wherein:
    the coated substrate is substantially transparent,
    the graphene film has a resistance of less than about 10 KΩ/sq and a thickness ranging from about 1 nm to about 200 nm, and
    the graphene film comprises at least one multi-layer horizontal graphene sheet and at least one single-layer vertical graphene sheet; and wherein the single-layer vertical graphene sheet has a height ranging from 1 nm to 200 nm.

2. The coated substrate of claim 1, wherein the coated substrate has a transmittance of at least about 80% in the visible light spectrum.

3. The coated substrate of claim 1, wherein the graphene film has a resistance of less than about 3 KΩ/sq.

4. The coated substrate of claim 1, wherein the multi-layer horizontal graphene sheet comprises from 3 to 20 graphene layers.

5. The coated substrate of claim 1, wherein the single-layer vertical graphene sheet has a thickness ranging from about 0.3 nm to about 10 nm.

6. The coated substrate of claim 1, wherein the substrate is chosen from glass, glass-ceramic, and crystalline substrates.

* * * * *

UNITED STATES PATENT AND TRADEMARK OFFICE
CERTIFICATE OF CORRECTION

PATENT NO. : 11,708,271 B2
APPLICATION NO. : 16/062301
DATED : July 25, 2023
INVENTOR(S) : Hui Bi et al.

It is certified that error appears in the above-identified patent and that said Letters Patent is hereby corrected as shown below:

On the Title Page

In item (65), in Column 1, in "Prior Publication Data", Line 2, below "Dec. 20, 2018" insert -- Foreign Application Priority Data Dec. 15, 2015 (CN) ........... 201510941214.3. -- as a new field entry.

In the Specification

In Column 1, Line 11, delete "by," and insert -- by --.

Signed and Sealed this
Twenty-third Day of July, 2024

Katherine Kelly Vidal
*Director of the United States Patent and Trademark Office*